US009582615B2

(12) United States Patent
Carbonera

(10) Patent No.: US 9,582,615 B2
(45) Date of Patent: Feb. 28, 2017

(54) MODELING USING THIN PLATE SPLINE TECHNOLOGY

(71) Applicant: Jostens, Inc., Minneapolis, MN (US)

(72) Inventor: Carlos D. Carbonera, St. Paul, MN (US)

(73) Assignee: Jostens, Inc., Minneapolis, MN (US)

( * ) Notice: Subject to any disclaimer, the term of this patent is extended or adjusted under 35 U.S.C. 154(b) by 429 days.

(21) Appl. No.: 14/156,548

(22) Filed: Jan. 16, 2014

(65) Prior Publication Data

US 2014/0200698 A1    Jul. 17, 2014

Related U.S. Application Data

(60) Provisional application No. 61/753,248, filed on Jan. 16, 2013.

(51) Int. Cl.
| G06F 19/00 | (2011.01) |
| G06F 17/50 | (2006.01) |
| B29C 67/00 | (2006.01) |

(52) U.S. Cl.
CPC .......... G06F 17/50 (2013.01); *B29C 67/0051* (2013.01)

(58) Field of Classification Search
CPC ....................................................... G06F 17/50
USPC .................................................... 700/98–129
See application file for complete search history.

(56) References Cited

U.S. PATENT DOCUMENTS

| 2,858,897 | A | 11/1958 | Kraemer |
| 3,910,066 | A | 10/1975 | Strack |
| 3,964,915 | A | 6/1976 | Doenges et al. |
| 4,004,333 | A | 1/1977 | Daniels |
| 4,561,061 | A | 12/1985 | Sakamoto et al. |
| 4,630,309 | A | 12/1986 | Karow |
| 4,761,865 | A | 8/1988 | Magnien |
| 4,771,474 | A | 9/1988 | Takashima et al. |
| 4,796,442 | A | 1/1989 | Sarcona |
| 4,918,611 | A | 4/1990 | Shyu et al. |
| 4,969,201 | A | 11/1990 | Takasaki et al. |
| 4,972,323 | A | 11/1990 | Cauwet |
| 5,003,498 | A | 3/1991 | Ota et al. |
| 5,007,098 | A | 4/1991 | Kumani |
| 5,116,174 | A | 5/1992 | Fried et al. |
| 5,184,307 | A * | 2/1993 | Hull .................... B29C 67/0066 156/273.3 |
| 5,249,670 | A | 10/1993 | Simon |

(Continued)

FOREIGN PATENT DOCUMENTS

| FR | 2536969 | 6/1984 |
| FR | 2829366 | 3/2003 |

(Continued)

OTHER PUBLICATIONS

Prasad, Biren, and S. Gundapeneni. "CAD Software System Requirements for Concurrent Engineering." SAE Special Publication SP-1146, SAE Paper 960550 (1996). pp. 77-84.*

(Continued)

*Primary Examiner* — Satish Rampuria
(74) *Attorney, Agent, or Firm* — Husch Blackwell LLP

(57) ABSTRACT

A method of modeling may include obtaining an input file defining a first geometry, establishing a control related to the first geometry, adjusting the control, and using a thin plate spline transform to adjust the first geometry to a second geometry based on the control.

5 Claims, 8 Drawing Sheets

(56) References Cited

U.S. PATENT DOCUMENTS

| | | | |
|---|---|---|---|
| 5,261,768 A | 11/1993 | Loucks et al. | |
| 5,329,381 A | 7/1994 | Payne | |
| 5,369,736 A | 11/1994 | Kato et al. | |
| 5,377,506 A | 1/1995 | Tranzer | |
| 5,473,742 A | 12/1995 | Polyakov et al. | |
| 5,532,933 A | 7/1996 | Nakata | |
| 5,544,291 A | 8/1996 | Gilley et al. | |
| 5,548,698 A | 8/1996 | Smith et al. | |
| 5,569,003 A | 10/1996 | Goldman et al. | |
| 5,587,913 A | 12/1996 | Abrams et al. | |
| 5,588,310 A | 12/1996 | Lai | |
| 5,649,079 A | 7/1997 | Holmes | |
| 5,668,930 A | 9/1997 | Hamura et al. | |
| 5,677,855 A * | 10/1997 | Skeeters | G05B 19/4099 700/164 |
| 5,689,577 A | 11/1997 | Arata | |
| 5,739,822 A | 4/1998 | Paradine | |
| 5,739,912 A | 4/1998 | Ishii | |
| 5,772,947 A * | 6/1998 | Hull | B29C 67/0066 264/308 |
| 5,790,713 A | 8/1998 | Kamada et al. | |
| 5,850,222 A | 12/1998 | Cone | |
| 5,926,388 A | 7/1999 | Kimbrough et al. | |
| 5,926,389 A | 7/1999 | Trounson | |
| 5,968,564 A | 10/1999 | Welsh et al. | |
| 5,977,007 A | 11/1999 | Lassow et al. | |
| 6,003,228 A | 12/1999 | Riggio | |
| 6,083,267 A | 7/2000 | Motomiya et al. | |
| 6,085,126 A | 7/2000 | Mellgren, III et al. | |
| 6,101,280 A | 8/2000 | Reynolds | |
| 6,124,858 A | 9/2000 | Ge et al. | |
| 6,138,055 A | 10/2000 | Pryor | |
| 6,181,839 B1 | 1/2001 | Kannon et al. | |
| 6,249,289 B1 | 6/2001 | Arnaud et al. | |
| 6,260,383 B1 | 7/2001 | Warren et al. | |
| 6,300,595 B1 | 10/2001 | Williams | |
| 6,349,758 B1 | 2/2002 | Bell | |
| 6,407,361 B1 | 6/2002 | Williams | |
| 6,434,277 B1 | 8/2002 | Yamada et al. | |
| 6,510,539 B1* | 1/2003 | Deemie | G06F 17/5068 712/12 |
| 6,546,305 B1 | 4/2003 | Hruby | |
| 6,568,455 B2 | 5/2003 | Zieverink | |
| 6,600,488 B1 | 7/2003 | Moreton et al. | |
| 6,628,279 B1 | 9/2003 | Schell et al. | |
| 6,763,279 B2 | 7/2004 | Davis | |
| 6,856,314 B2 | 2/2005 | Ng | |
| 6,877,916 B2 | 4/2005 | Khaikin | |
| 6,978,230 B1 | 12/2005 | Klosowski et al. | |
| 6,982,710 B2 | 1/2006 | Salomie | |
| 7,003,371 B2 | 2/2006 | Tsuchida et al. | |
| 7,006,089 B2 | 2/2006 | Baumberg | |
| 7,069,108 B2 | 6/2006 | Saarela et al. | |
| 7,091,963 B2 | 8/2006 | Dreservic et al. | |
| 7,236,180 B2 | 6/2007 | Dreservic et al. | |
| 7,593,786 B2 | 9/2009 | Saarela et al. | |
| 7,747,055 B1 | 6/2010 | Vinig et al. | |
| D625,216 S | 10/2010 | Morgan | |
| 7,856,285 B2 | 12/2010 | Carbonera et al. | |
| D639,108 S | 6/2011 | Molayem | |
| 8,085,266 B2 | 12/2011 | Carbonera et al. | |
| 8,126,683 B2 | 2/2012 | Carbonera et al. | |
| D684,880 S | 6/2013 | Matysik | |
| 8,473,088 B2 | 6/2013 | Carbonera et al. | |
| 8,515,826 B2 | 8/2013 | Norman | |
| RE44,696 E | 1/2014 | Saarela et al. | |
| D734,976 S | 7/2015 | Quinn | |
| 2001/0044668 A1 | 11/2001 | Kimbrough et al. | |
| 2002/0049648 A1 | 4/2002 | Inoue et al. | |
| 2002/0063912 A1 | 5/2002 | Barbanell | |
| 2002/0085748 A1 | 7/2002 | Baumberg | |
| 2002/0092322 A1 | 7/2002 | Zieverink | |
| 2002/0113865 A1 | 8/2002 | Yano et al. | |
| 2002/0128742 A1 | 9/2002 | Zieverink | |
| 2002/0154122 A1 | 10/2002 | Di Lelle | |
| 2002/0159638 A1 | 10/2002 | Ratner et al. | |
| 2002/0181802 A1 | 12/2002 | Peterson | |
| 2002/0191863 A1 | 12/2002 | Biermann et al. | |
| 2004/0020241 A1 | 2/2004 | Boiadjian | |
| 2004/0091143 A1 | 5/2004 | Hu | |
| 2004/0111178 A1* | 6/2004 | Saarela | B44B 3/009 700/193 |
| 2004/0237822 A1 | 12/2004 | Boland et al. | |
| 2005/0086134 A1 | 4/2005 | Bar et al. | |
| 2005/0089237 A1 | 4/2005 | Park et al. | |
| 2005/0147312 A1 | 7/2005 | Chen | |
| 2005/0149409 A1 | 7/2005 | Whaley | |
| 2005/0160574 A1 | 7/2005 | Bazin et al. | |
| 2005/0171866 A1 | 8/2005 | Herbert et al. | |
| 2005/0222862 A1 | 10/2005 | Guhde et al. | |
| 2006/0001664 A1 | 1/2006 | Carbonera | |
| 2006/0096731 A1 | 5/2006 | Do et al. | |
| 2006/0200269 A1 | 9/2006 | Saarela et al. | |
| 2006/0217037 A1 | 9/2006 | Kalanovic | |
| 2006/0224462 A1 | 10/2006 | Brezenoff | |
| 2006/0290695 A1 | 12/2006 | Salomie | |
| 2007/0250456 A1 | 10/2007 | Braunwart | |
| 2008/0040080 A1 | 2/2008 | Bae et al. | |
| 2008/0177410 A1* | 7/2008 | Carbonera | B44B 1/006 700/98 |
| 2008/0229784 A1 | 9/2008 | Carbonera et al. | |
| 2009/0056373 A1 | 3/2009 | Czajka et al. | |
| 2009/0060393 A1 | 3/2009 | Satoh | |
| 2009/0110307 A1 | 4/2009 | Markowitz | |
| 2009/0127138 A1 | 5/2009 | Allameh | |
| 2009/0263624 A1 | 10/2009 | Illston | |
| 2010/0152873 A1 | 6/2010 | Dunne et al. | |
| 2010/0169059 A1 | 7/2010 | Thomas-Lepore et al. | |
| 2010/0274610 A1 | 10/2010 | Andersen et al. | |
| 2010/0323154 A1 | 12/2010 | Sharobiem | |
| 2011/0144785 A1 | 6/2011 | Carbonera et al. | |
| 2011/0145100 A1 | 6/2011 | Berger et al. | |
| 2011/0213482 A1* | 9/2011 | Saarela | A44C 27/00 700/98 |
| 2011/0282476 A1 | 11/2011 | Hegemier et al. | |
| 2011/0307349 A1 | 12/2011 | Gandhi et al. | |
| 2011/0313878 A1 | 12/2011 | Norman | |
| 2012/0075297 A1 | 3/2012 | Carbonera et al. | |
| 2012/0116729 A1 | 5/2012 | Carbonera et al. | |
| 2012/0168024 A1 | 7/2012 | Beck et al. | |
| 2012/0234044 A1 | 9/2012 | Matysik | |
| 2013/0085792 A1 | 4/2013 | Klein | |
| 2013/0204736 A1 | 8/2013 | Klein | |
| 2013/0218714 A1 | 8/2013 | Watkins et al. | |
| 2013/0326457 A1 | 12/2013 | MacMunn et al. | |
| 2014/0052563 A1 | 2/2014 | Watkins et al. | |
| 2014/0075988 A1 | 3/2014 | Matysik | |
| 2015/0026015 A1 | 1/2015 | Fishman et al. | |
| 2015/0055085 A1 | 2/2015 | Fonte et al. | |
| 2015/0055086 A1 | 2/2015 | Fonte et al. | |

FOREIGN PATENT DOCUMENTS

| | | |
|---|---|---|
| FR | 2880521 | 7/2006 |
| JP | 2003150666 | 5/2003 |
| WO | 0057254 | 8/2000 |
| WO | 0193156 | 12/2001 |
| WO | 2004053653 | 6/2004 |

OTHER PUBLICATIONS

Ashkenazi, D., I. Taxel, and O. Tal. "Archeometallurgical characterization of Late Roman-and Byzantine-period Samaritan magical objects and jewelry made of copper alloys." Materials Characterization 102 (2015): pp. 195-208.*

Fata, R. G., and D. G. Fabricant. "Mounting large lenses in wide-field instruments for the converted MMT." pp. 275-284.*

"2004 Your Guide to feature-based Manufacturing", Jun. 2003, Engineering Geometry Systems, Tenth Edition, pp. 13-66, 153-182, 291-298, 311-342, 369, 380, 441-457.

Patent Abstracts of Japan, vol. 2003, No. 9, Sep. 3, 2003.

(56) References Cited

OTHER PUBLICATIONS

International Search Report for PCT Application No. PCT/US2005/013469, mailed Sep. 6, 2005.

Sigmund et al. "Transformations between Pictures from 2D to 3D", Jun. 2000, Journal of Intelligent and Robotic Systems, vol. 28, pp. 69-84.

Hendricks, Bob. "Henricks Mfg. Jewellers-CNC Production of Wax Models Boosts Ring Sales by 50%", www.techno-isel.com/CNC_Routers/Testimonials/Articles/Hendricks.htm, Nov. 25, 2001.

Wick et al. "Tool and Manufacturing Engineers Handbook", 1998, Society of Manufacturing Engineers, vol. 3, Chapter 15, pp. 15-1, 15-2, and 15-25.

Wirth, Joachim "Rapid Modeling", Carl Hanser Verlag, Munchen, 2002, pp. 60-62, 170-177.

International Search Report and Written Opinion. International Patent Application No. PCT/US2008/056705. Mailed Apr. 8, 2008.

Techjewel, "TechGems 3.0", User Guide, 2004.

Stamati et al. "A Parametric Feature-based CAD System for Reproducing Traditional Pierced Jewellery", Computer-Aided Design, vol. 37, Issue 4, pp. 431-449, Apr. 2005.

Wannarumon et al. "Intelligent Computer System for Jewelry Design Support", Computer Aided Design and Applications, 1 (1-4) 551-558, 2004.

Rowan, Mark, "Automated Methods for Evolutionary Pave Jewellery Design", The University of Birmingham School of Computer Science, Jan. 15, 2006.

Delcam plc, "ArtCAM JewelSmith User Gu de", Issue 7.1 Sep. 11, 2004.

Wannarumon et al. "Rapid Prototyping and Tooling Technology in Jewelry CAD", Computer-Aided Design and Applications, Jan. 2004, vol. 1, No. 1-4 (pp. 569-575).

Park, Sang C. "Polygonal extrusion", The Visual Computer, Jan. 28, 2003, Springer-Verlag, pp. 38-49.

Stam, Jos et al. "Quad/Triangle Subdivision", Computer Graphics Forum, vol. 22, No. 1, Apr. 2003, pp. 79-85.

* cited by examiner

MODELING USING THIN PLATE SPLINE TECHNOLOGY

CROSS-REFERENCE TO RELATED APPLICATIONS

The present application claims priority to U.S. Provisional Patent Application No. 61/753,248, entitled Thin Plate Spline, filed on Jan. 16, 2013, the content of which is hereby incorporated by reference herein in its entirety.

FIELD OF THE INVENTION

The present disclosure relates generally to computer modeling for manufacturing. More particularly, the present disclosure relates generally to use of spline technology to produce computer models for use in growing wax models with a rapid prototyping process. Still more particularly, the present disclosure relates to using thin plate spline technology to size and arrange elements in a computer model for producing a wax model or series of wax models of a ring.

BACKGROUND

Rapid prototyping involves a process of depositing material in layers to build three-dimensional objects. In the case of jewelry manufacturing, the deposited material may be wax and the rapid prototyping process may be used to build wax models. The wax models may be used in a lost wax process to create a metal piece of jewelry such as a ring, for example. The use of rapid prototyping to create wax models for jewelry is described in a series of U.S. Patent Applications entitled "Method for Digital Manufacturing of Jewelry Items" with the following application serial numbers and filing dates: 61/308,245 filed on Feb. 25, 2010; Ser. No. 13/035,742 filed on Feb. 25, 2011; and 61/694,546 filed on Aug. 29, 2012. These applications are hereby incorporated by reference herein in their entireties.

The rapid prototyping process relies on a computer model that a rapid prototyping machine may transform into a physical wax model by growing it (i.e., printing it on a substrate in a series of layers). The creation of the computer model, or portions thereof, may be performed in several ways, but other approaches are needed.

SUMMARY

In one embodiment, a method of modeling may include obtaining an input file such as an STL file, for example, defining a first geometry. A control may be established relating to the first geometry such as a boundary control curve or a plurality of source control points. The method may also include adjusting the control to adjust the first geometry. The method may also include using a thin plate spline transform to adjust the first geometry to a second geometry based on the control adjustment.

In one embodiment, a method for creating a model of a bezel of a ring may include accessing an input file defining two dimensional text arranged in an annular shape having an inner boundary curve and an outer boundary curve arranged in a plane. The method may also include receiving input regarding the adjustment of the size of one of the inner and outer boundary curves. The method may also include using a thin plate spline transform to cause the text to expand or contract based on the boundary curve adjustment to define adjusted text. The method may also include extruding the adjusted text to create three dimensional adjusted text and receiving input regarding the adjustment of the location of one of the inner and outer boundary curves in a direction generally out of the plane. The method may also include using a thin plate spline transform to cause the three dimensional adjusted text to rotate out of the plane about one of the inner and outer boundary curves to define a model of bezel text for the ring.

In another embodiment, a method for adjusting the size of a ring may include obtaining an STL file defining a surface of a ring, receiving input regarding a plurality of source control points, and receiving input regarding a plurality of target control points. The method may also include mapping the plurality of source control points to the plurality of target control points and using a thin plate spline transform to adjust the STL file to define a new surface of the ring.

While multiple embodiments are disclosed, still other embodiments of the present invention will become apparent to those skilled in the art from the following detailed description. As will be apparent, the invention is capable of modifications in various obvious aspects, all without departing from the spirit and scope of the present invention. Accordingly, the detailed description is to be regarded as illustrative in nature and not restrictive.

BRIEF DESCRIPTION

DETAILED DESCRIPTION

Figure 5:
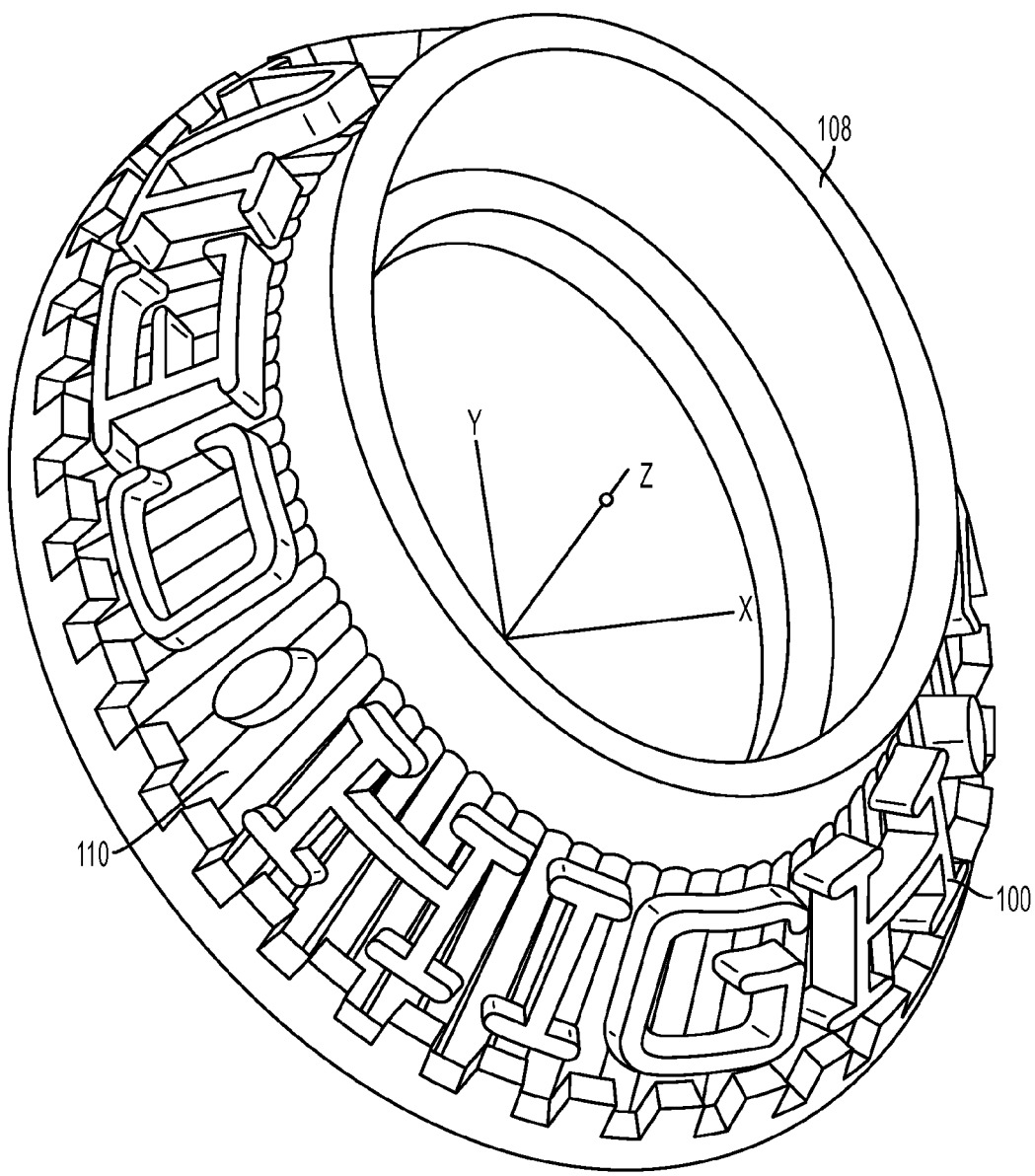
FIG. 5 is a perspective view of the text of FIGS. 2-4, where the three dimensional model of the text has been arranged on the bezel of a ring, according to some embodiments.

The present disclosure, in some embodiments, includes discussions of using a thin plate spline process for manipulating computer models. In some cases, the computer models are of jewelry and a thin plate spline transform is used for adjusting particular aspects of the jewelry. In one example, the thin plate spline process is used to transform a two dimensional annularly arranged text display, as shown in FIG. 1, into a three dimensional model as shown in FIG. 5.

Figure 6A:
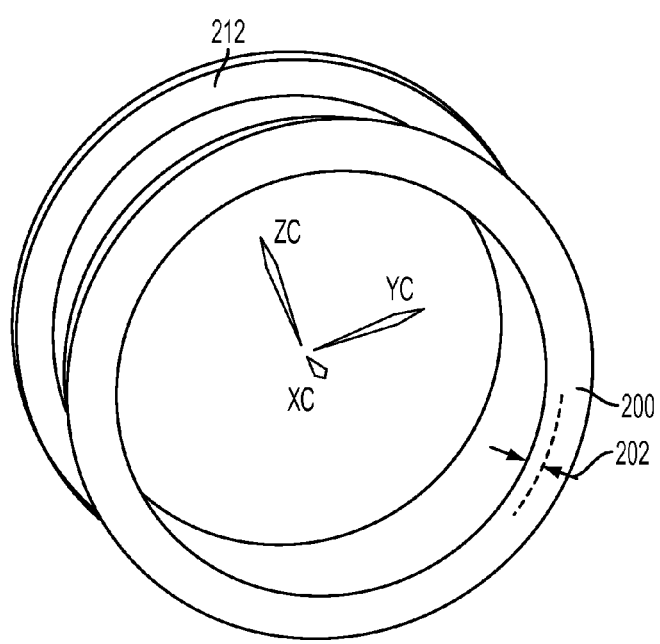
FIG. 6A is a perspective view of band ring, according to some embodiments.
Figure 6B:
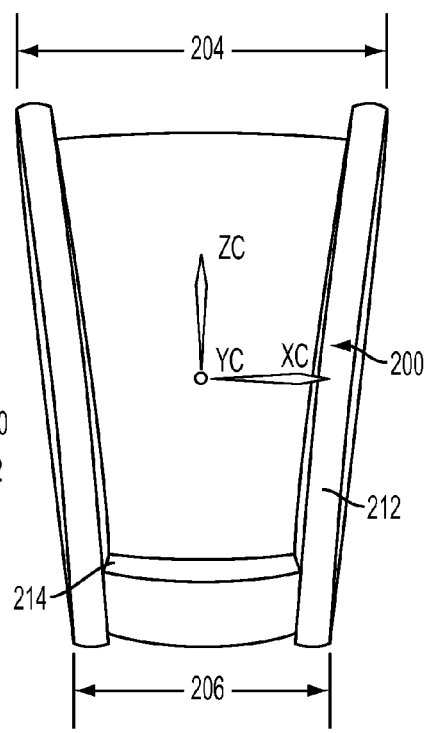
FIG. 6B is a side view of the band ring of FIG. 6A, according to some embodiments.
Figure 7A:
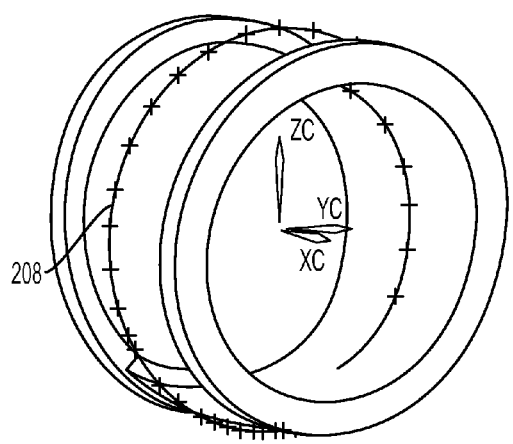
FIG. 7A is a perspective view of the band ring of FIGS. 6A and 6B showing source control points.
Figure 7B:
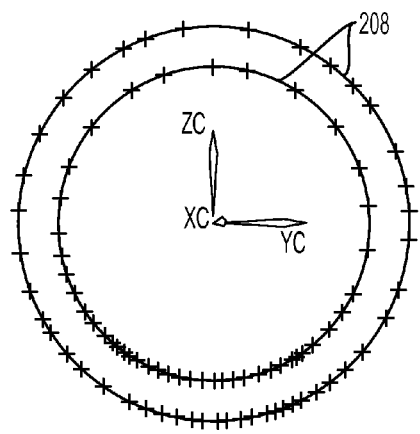
FIG. 7B is a side view of the band ring with source control points of FIG. 7A, according to some embodiments.
Figure 8A:
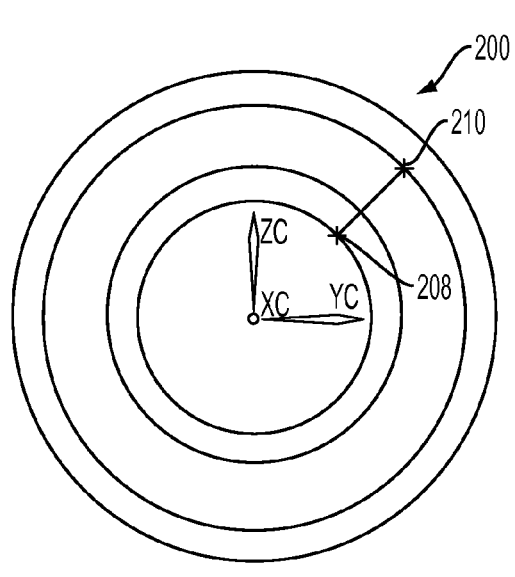
FIG. 8A is a side view of a small size ring and a large size ring created from the small size ring and showing source control points and target control points, according to some embodiments.
Figure 8B:
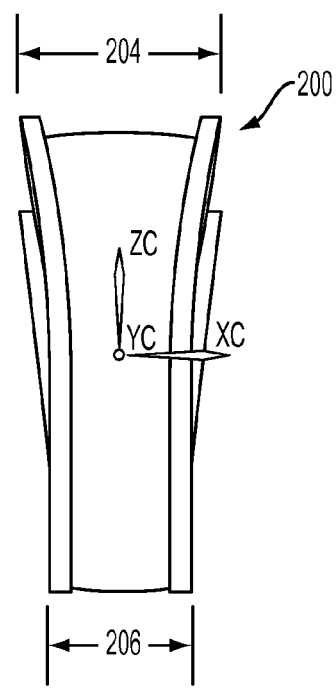
FIG. 8B is another side view of the small and large size ring of FIG. 8A.

In another embodiment, the thin plate spline process is used to transform a three dimensional model of a ring, such as that shown in FIG. 6A, into a series of differently sized rings, as shown in FIGS. 8A and 8B. The thin plate spline process is advantageous because of its ability to non-linearly transform a starting two dimensional or three dimensional model into a finished two or three-dimensional model. In particular, the transformation described in FIGS. 1-5 may allow for an inner boundary to be maintained, while an outer boundary is increased and may further allow the extruded text to be tipped relative to a horizontal plane. The transform described in FIGS. 6-8 may allow particular dimensions of a ring to be held constant while other dimensions are adjusted for a series of several ring sizes, for example. Still other non-linear transformations may also be performed.

Figure 1:
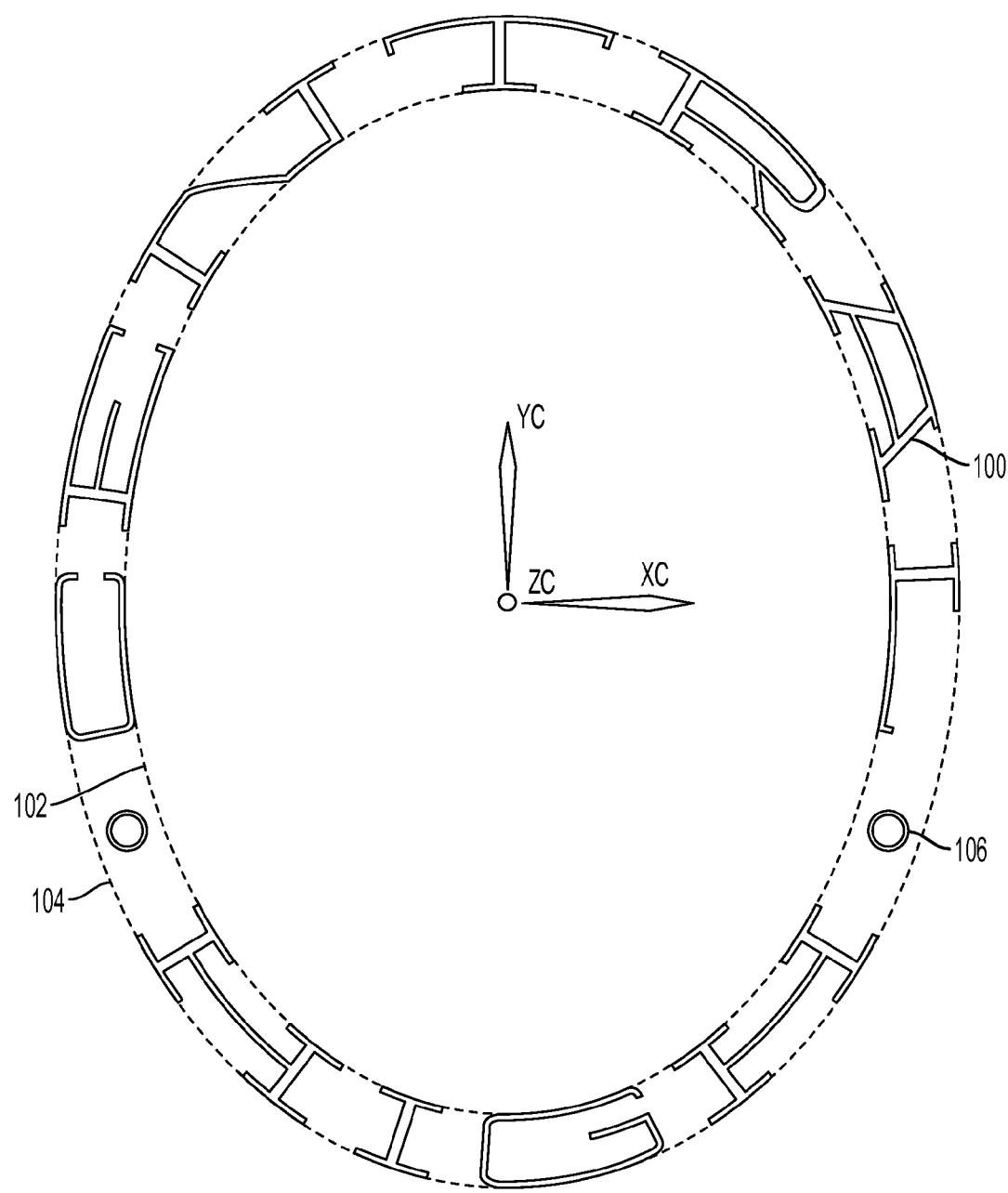
FIG. 1 is a top view of a two dimensional arrangement of text for a bezel of a ring, according to some embodiments.

Referring now to FIG. 1, an initial layout of bezel text 100 for a ring is shown. In some embodiments, the letters of bezel text 100 on a ring may be selected or determined by a student ordering a ring, for example, and may be customizable and/or personalizable for the order. In the context of class rings, and given the number of schools and the number of students in each school, the quantity of differing orders may be quite substantial. As such, the ability to automate the creation of a model for use in the rapid prototyping process is very advantageous.

It is noted that the presently described approach to creating the wax model for bezel text may differ from or include some of the same steps or systems that are described in U.S. patent applications Ser. Nos. 12/016,881 and 12/958,993, entitled System and Method for Generating Instructions for Customization. These applications are hereby incorporated by reference herein in their entireties. In these applications, the approach to bezel text modeling includes the creation of a set of trimmed surfaces representing the top level of the text and a toolpath may be created from those surfaces. With this approach, the toolpath may be developed based on an understanding that the tool motion is in the z-direction (i.e., in/out of the page). With this approach, the resulting bezel text may have a beveled outer surface (i.e., the surface of the letters may be angled relative to the horizontal), but the letters of the text may appear to be extruded in a generally vertical direction. In the process described herein, one advantage is that aesthetics of the bezel text may be improved by allowing the text to project generally perpendicular to the bezel surface rather than being limited to projecting generally vertically from the bezel surface. Accordingly, the text may appear to project generally radially from a generally rounded upper portion (i.e., bezel and stone) of a ring.

In the present embodiment, the text 100 may be retrieved from an input file and may initially be arranged between a pair of boundary curves 102, 104, as shown in FIG. 1. The text 100 may be in the form of a two-dimensional STL file, for example, defining two-dimensional triangulated surfaces of the text 100. In some embodiments, a divider 106, a pair of dividers, or other number of dividers may be included and the text 100 may be designed to wrap around the full length of the curve such that the text near the bottom appears upside down, or the text may be arranged to appear upright along the top and also upright along the bottom as shown in FIG. 1.

Figure 2:
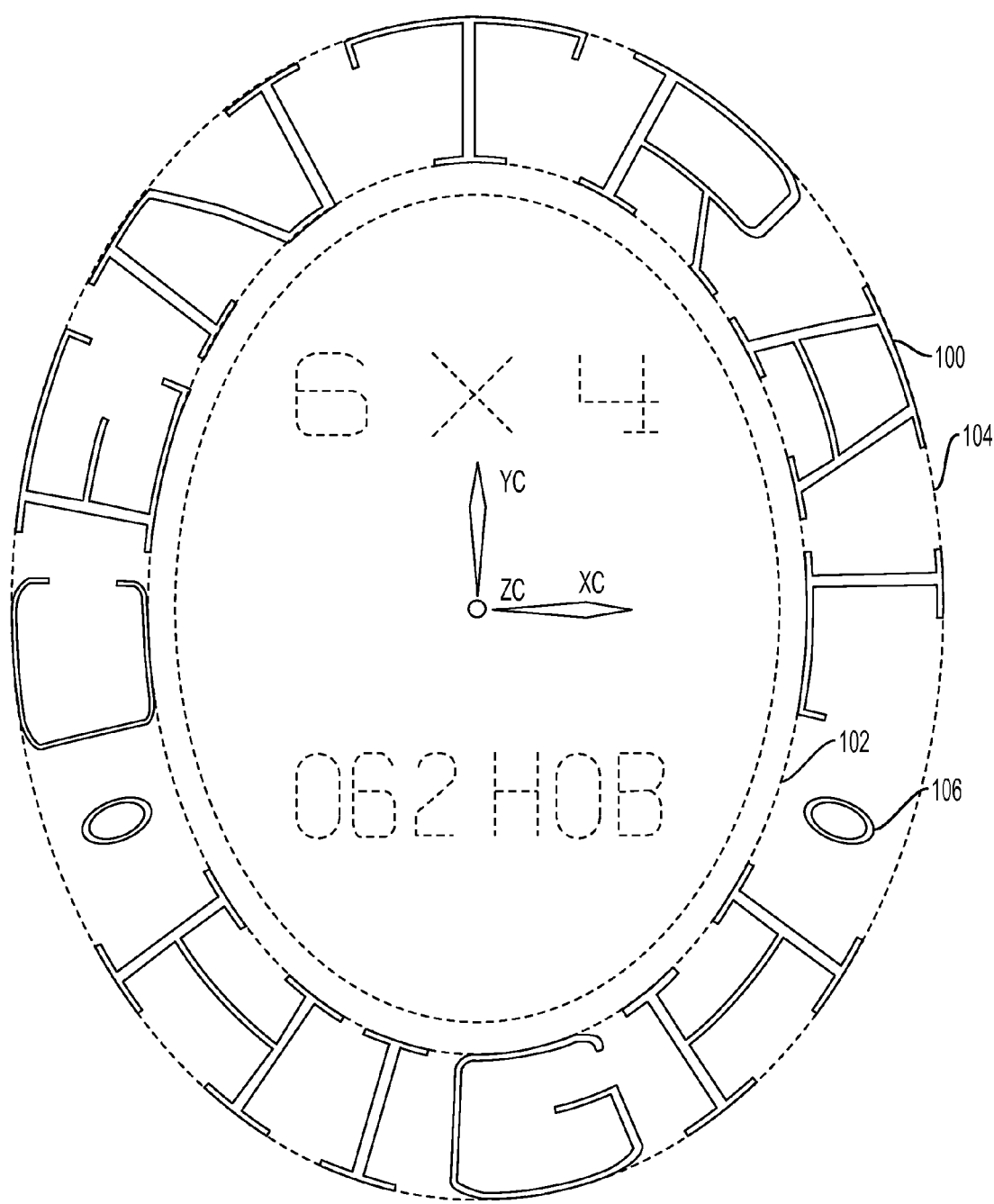
FIG. 2 is a top view of a two dimensional arrangement of text, where the text has been stretched to a larger size, according to some embodiments.

Given the initial set of boundary curves 102, 104 with the text 100 arranged therebetween, a first thin plate spline transform may be used to expand or decrease the text 100 to a desired size. For example, as shown in FIG. 2, the inner curve 102 and the outer curve 104 may be mapped to a new inner curve 102 and a new outer curve 104. That is, input may be received that defines a new location for one or more of the curves 102, 104. The input may be an offset distance, for example, or a scale by which to increase or decrease the curve size. Still other inputs for modifying the curve locations may be used. In the embodiment shown, the new inner curve 102 is the same as the original inner curve 102, while the new outer curve 104 is larger than the original outer curve 104. In this example, the thin plate spline transform may be akin to a two dimensional morphing of an image, for example. That is, in contrast to a scaling process where, for example, each point of a model may be adjusted by a percentage distance away from a center, in the present example, the points of the text along the outer curve are extended outward by the selected offset distance and the remaining points are displaced by a distance determined by how close they are to the outer and inner boundary curves. The closer the point is to the outer curve, the more the point moves and the closer the point is to the inner curve, the less the point moves. The points that are on the inner curve may not move at all. It is to be appreciated that this particular transform is just one example, and other transforms may be provided, where, for example, the inner curve 102 moves inward or outward or where the outer curve 104 moves inward or outward or stays stationary or where both curves 102, 104 move inward and/or outward.

Figure 3:
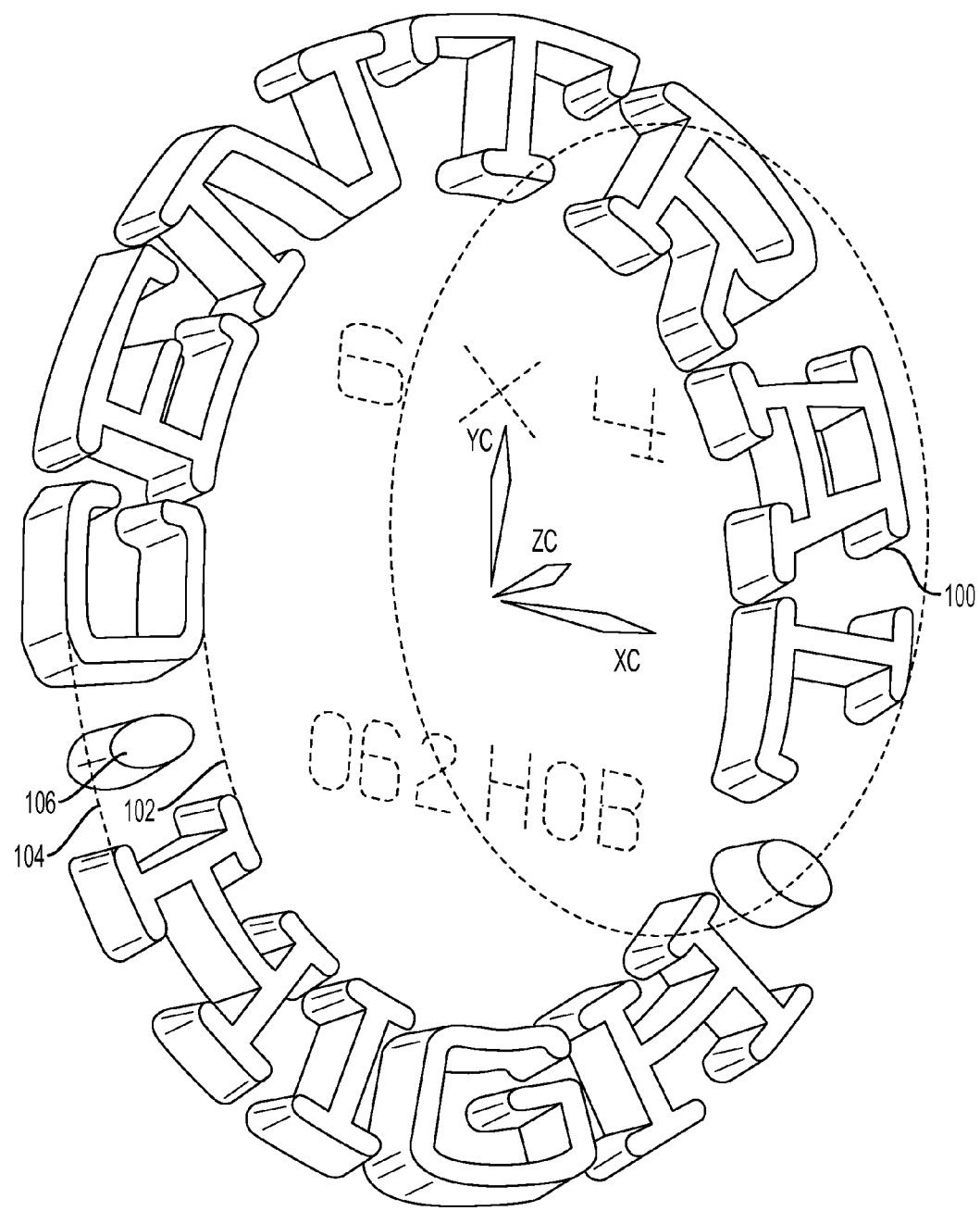
FIG. 3 is a perspective view of the text of FIG. 2, where the text has been extruded to form a three dimensional model of the text, according to some embodiments.

The text 100 may also be extruded to create a three-dimensional model of the text, as shown in FIG. 3. For example, a three-dimensional STL file may define the extruded text 100. It is noted that the three-dimensional model may remain substantially planar where the top surface of the text 100 and dividers 106 is in a top plane and the bottom surface of the text 100 and dividers 106 is in a bottom plane parallel to the top plane. The depth of the extrusion may be input by a user and may be selected based on a range of reasonable letter heights of a ring, for example. It is noted, that while the text 100 has been extruded, the reference or control boundary curves 102, 104 for the thin plate spline process may be located along the top surface of the text 100. In other embodiments, the control boundary curves 102, 104 may be arranged along the bottom surface of the text 100, at the mid-height of the text, or at some other location within the height of the text 100. In still other embodiments, the control boundary curves 102, 104 may be arranged outside the thickness of the extruded model.

Figure 4:
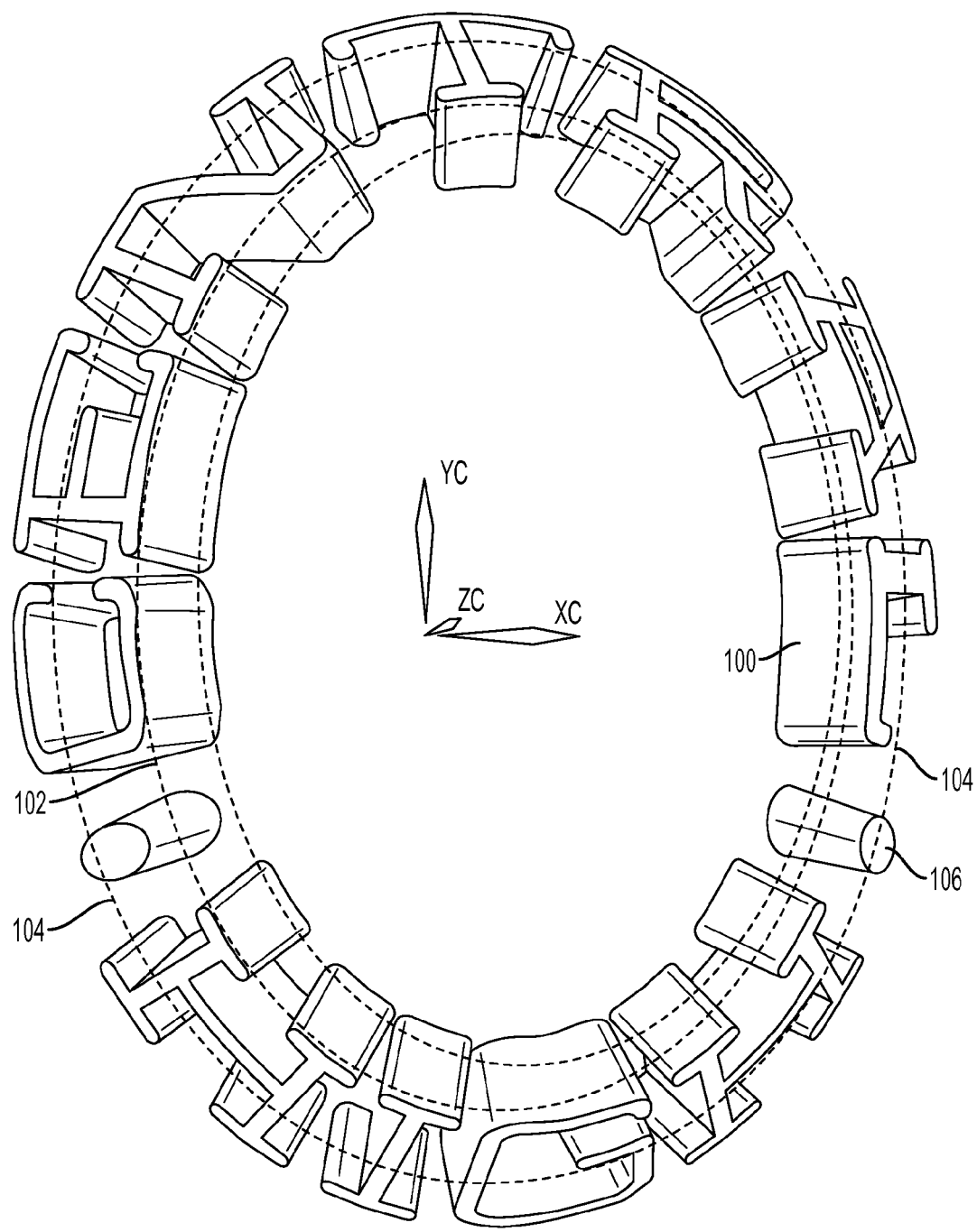
FIG. 4 is a perspective view of the text of FIGS. 2-3, where the text of the three dimensional model has been arranged for placement on a bezel of a ring, according to some embodiments.

An additional thin plate spline transform may be used to modify the three-dimensional model of the text 100 from the substantially planar and extruded arrangement of FIG. 3 to the bezel-shaped arrangement of FIG. 4. Again, and similar to the first thin plate spline transform, the boundary curves 102, 104 shown in FIG. 3 may be mapped to the new locations shown in FIG. 4 causing the three-dimensional text 100 to track with the new curve locations and form the shown shape where the inner/under surface of the three-dimensional text 100 is adapted for placement on a bezel of a ring. In this embodiment, for example, input may be received such that the new outer boundary curve 104 may have a location that is lower than the planar outer boundary curve 104 and the new inner boundary curve 102 may have a location that is the same as the planar inner boundary curve 102. Accordingly, as the three-dimensional text transitions between the planar condition of FIG. 3 to the bezel condition of FIG. 4, each letter of the text 100 may generally rotate about the inner curve 102 based on the movement of the outer curve 104 from a location in plane with the inner curve 102 to a location that is out of plane from and lower than the inner curve 102. While the boundary curve adjustments have been described as being inputs, standard adjustments may be automatic. For example, where a particular bezel size is being used, the downward offset of the outer boundary curve 104 may be a preset value, for example, such that the angle of tip of the text 100 is suitable for the particular bezel size.

A solid modeling union may then be performed with the three-dimensional text 100 of FIG. 4 and a base bezel geometry 108 to create the final bezel as shown in FIG. 5. As shown, the three-dimensional text 100 of FIGS. 4 and 5 has an aesthetic appearance where the three-dimensional letters project generally perpendicular to the bezel surface 110.

Referring now to FIGS. 6A-8B, a thin plate spline process may be used to provide a size ladder for ring designs. That is, the process may be used to provide a series of ring sizes for one or more rings, for example. As shown in FIGS. 6A and 6B, a three dimensional model of a band ring 200 is shown. In some cases, it may be desired to create the above-mentioned size ladder while maintaining (i.e., holding constant) particular aspects or dimensions of the ring 200. For example, as different ring sizes are created based on an initial model such as that of FIGS. 6A and 6B, a manufacturer may desire to keep the thickness 202 of the ring constant between sizes. In addition, a manufacturer may desire to keep the width 204, 206 at the top and bottom of the ring 200, shown in FIG. 6B, constant. However, to provide for differing sized rings, the inside diameter may be varied from one ring size to another. Still other aspects of the ring 200 or other jewelry item may be selected as desirable to maintain constant or to vary.

This desire to maintain selected aspects of the ring 200 while changing other aspects or dimensions of the ring 200 may foreclose a mere linear scaling of the ring 200. That is, were the several sizes merely scaled upward through a series of ring sizes, the increasing inside diameters may naturally cause the thickness 202 of the ring 200 and the widths 204, 206 at the top and bottom of the ring 200 to increase proportionally with the inside diameter.

In some known embodiments, parametric modeling capabilities of an advanced CAD system such as Siemen's Unigraphics (UG) system may be used to provide the desired non-linear changes. However, these known systems require that the ring 200 be modeled with particular parameters (e.g., inside diameter, thickness, width at palm, width at top, and arc length of panel at the bottom) allowing some of the parameters to be held constant while other parameters are allowed to change. This process of modeling with particular parameters and setting each of the parameters to be changeable or constant can be very time-consuming and requires a relatively high-end and expensive CAD system. Where parametric models exist, they may be used to provide the non-linear changes. However, where a parametric model is not available, the described process may be quite advantageous.

One embodiment of a process for using a thin plate spline approach to non-linearly increase or decrease the size of a ring 200 may be as follows. Initially, computer aided drafting (CAD) data may be obtained for a ring design 200 and a stereo lithographic (STL) mesh may be created. A series of source control points 208 may be selected and/or input by a user and a series of target control points may be input or calculated based on an input, for example. A thin plate spline transform may then be used to adjust the STL data and define a differently sized or shaped object based on the source control points 208 and the target control points. One or more of the operations may be repeated to create differently sized or shaped objects and, for example, a ladder of ring models may be created for a particular ring design or base design 200.

The CAD data may reflect a wide range of objects. In some embodiments, the CAD data may include a ring design 200 which may be a base design or a more evolved design. For example, as shown in FIG. 6A, a base ring 200 such as a simple band ring may include an inside diameter and an outside diameter defining a thickness 202 and it may also include a pair of ribs 212 extending along the circumferential edges. In addition, a panel 214 may be provided that extends along the bottom of the ring between the ribs 212. However, in some embodiments, the CAD data may already be customized and/or personalized for the user. In this embodiment, the CAD data may include artwork details on the surface of the ring 200, a bezel or personalized bezel on the top of the ring 200 for receiving a stone, or other customized and/or personalized features. In either of the above cases, the CAD data may be obtained by accessing a database where the CAD data is stored. The CAD data may be in the form of one of several known file types.

The STL mesh may be created by common techniques known for converting CAD data to an STL format. Many common CAD software packages, for example, may include an export command particularly adapted to define a series of contiguous facets defining the surface of the CAD model where each facet has a normal vector for differentiating between an inner and outer surface of the facet. Commonly, the facets are defined by three sides and have the shape of a triangle. However, other numbers of sides may be provided. The STL file may, thus, include a mesh that defines the surface of the object or ring 200 previously represented by the CAD data.

One or more source control points 208 may be selected or input by the user for use in modifying the size, shape, orientation, or other aspect of the object or ring 200. Example control points 208 for creating a different sized ring, for example, are shown together with the ring FIG. 7A and are shown in isolation in FIG. 7B. These control points 208 may be selected with particular regard to the aspects of the ring 200 the user would like to maintain or keep constant. In the embodiment shown, for example, the thickness of the ring is desired to be kept constant. Accordingly, a set of source control points 208 may be selected on an inner surface and additional set of source control points 208 may be selected on an outer surface. Accordingly, as will be seen, when the target points are input and/or calculated and the thickness between the outer surface and inner surface of the target points is the same as the thickness between the outer surface and inner surface of the source control points 208, the process maintains the thickness of the ring. Additional strategies may be used to control other aspects of the object or ring modification. For example, as also shown in FIG. 6A, the source control points 208 may be selected to fall in a single plane. For example, as shown, both sets of control points 208 may be selected to fall on a center plane of the ring 200. This approach may be useful to avoid unwanted changes to the width 204, 206 of the ring 200, when the ring 200 is resized, for example. In some embodiments, the source control points 208 may be on the surface of the object or the points may be relatively close in proximity to the surface.

A corresponding number of target control points may be input or they may be calculated. For example, in the case of the ring of FIG. 7A, the source control points 208 may be offset by a selected distance and the offset may be input allowing the target control points to be calculated. For example, if the CAD data was for a size 6 ring with a diameter of 0.65 inches and a size 10 ring with a diameter of 0.778 inches is desired, the source control points may be offset by a distance of 0.064 inches (i.e., ½ of the difference of the diameters). It is noted that the method used to calculate the target control points may be selected with a particular effort to control some aspects of the object or ring. That is, for example, were the target control points calculated based on a percentage of their distance from the center of the ring, the thickness of the ring may be undesirably modified. In the above example, a particular offset distance is used rather than a scale value.

Given the STL file, a thin plate spline transform may be used to modify the STL file to create the desired model. Consistent with the bezel text example described with respect to FIGS. 1-5, the several portions of the ring 200 may be adjusted based on their proximity to the control points 208. That is, for example, a particular vertex of the STL file may be repositioned based on its proximity to a first control point 208 compared to one or more of the other control points.

Accordingly, the source control points 208 may be mapped to the target control points as shown in FIGS. 8A and 8B and the relationship between each of the source control points 208 and the model may be maintained thereby causing aspects of the mathematical model to change also. For example, as shown in FIG. 8A, the source control points 208 may be arranged a particular radial distance from the outer recessed surface of the ring 200. When the source control points 208 are offset to the new target control point 210 locations, the particular radial distance between the source control points 200 and the outer recessed surface may be maintained and may now be provided between the target control points 210 and the outer recessed surface. As such, the splines defining the outer recessed surface of the ring 200 may now define an outer surface further from the center of the ring 200 by a distance equal to the radial distance between the source control point 208 and the target control point 210. That is, the outer surface of the ring 200 may track with the change in position between the source control point 208 and the target control point 210.

It is noted that since no change in the position of the source control points 208 is made in the X direction, for example, no change is made to the model in that direction. Accordingly, the width 204, 206 of the ring at the bottom and the top remains the same from the starting ring size to the enlarged ring size.

The process herein described may be used to develop an full set of ring sizes for a given design called a size ladder. For purposes of clarity, FIGS. 8A and 8B show a smallest size of a ladder and a largest size of a ladder, but the intermediate sizes are not shown.

It is to be appreciated that while the above disclosure has been written to describe one or more methods, the methods may be performed by or in conjunction with a computing device. In some embodiments, the method steps described may be performed by one or more components or modules. The components or modules may include hardware, software, or a combination of hardware and software and may be configured to perform one or more of the above mentioned operations or steps. Where all or a portion of the modules are software, the software may be in the form of computer implemented instructions stored on a computer readable storage medium such as a hard disk, removable disc, flash drive, or other storage medium of a non-transitory nature and excluding transitory signals, for example. In some embodiments, the methods described herein may be used in conjunction with all or part of the method steps described in U.S. patent applications Ser. Nos. 11/109,496 and 13/311,813 entitled System and Method for Smoothing Three Dimensional images and U.S. patent applications Ser. Nos. 10/315,475, 11/415,724, and 13/237,247 entitled Automated Engraving a Customized Jewelry Item. These applications are hereby incorporated by reference herein in their entireties.

It is also to be appreciated that the methods herein described may also include using a rapid prototyping machine to print a physical model of the computer model. That is, the computer model may be uploaded, accessed by, or otherwise inputted to a rapid prototyping machine. The rapid prototyping machine may thus print a physical model of the computer model on a substrate by depositing a plurality of layers of material on a substrate to build the model. The model may be further processed using a vibratory bath or other method to remove any portions of the model not reflecting the desired object, ring, or jewelry item, for example. The resulting model may then be used in a lost wax process, for example to create a metal object, ring, or other jewelry item, for example. In still other embodiments, the resulting computer model may be used to develop a tool path for an engraving device or may be used by a printer to print a photo realistic image, for example.

Although the invention has been described with reference to various embodiments, persons skilled in the art will recognize that changes may be made in form and detail without departing from the spirit and scope of the invention.

What is claimed is:

1. A method for creating a model of a bezel of a ring, comprising:
   accessing an input stereo lithographic (STL) file defining two dimensional text arranged in an annular shape having an inner boundary curve and an outer boundary curve arranged in a plane;
   receiving input regarding the adjustment of the size of one of the inner and outer boundary curves;
   using a first thin plate spline transform to cause the text to expand or contract based on the boundary curve adjustment to define adjusted text;
   extruding the adjusted text to create three dimensional adjusted text; and
   receiving input regarding the adjustment of the location of one of the inner and outer boundary curves in a direction generally out of the plane; and
   using a second thin plate spline transform to cause the three dimensional adjusted text to rotate out of the plane about one of the inner and outer boundary curves to define a model of bezel text for the ring.

2. The method of claim 1, further comprising performing a solid model union with a base bezel and the bezel text.

3. A method for adjusting the size of a ring, comprising:
   obtaining an stereo lithographic (STL) file defining a surface of a ring;
   receiving input regarding a plurality of source control points;
   receiving input regarding a plurality of target control points; and
   mapping the plurality of source control points to the plurality of target control points and using a thin plate spline transform to adjust the STL file to define a new surface of the ring;
   wherein the plurality of source control points include a first plurality of points arranged along an outer surface of the ring and a second plurality of points arranged along an inner surface of the ring;

wherein the plurality of target control points include corresponding control points that are offset from the source control points by a selected distance thereby maintaining a thickness of the ring.

4. The method of claim 1, wherein the first and second plurality of points are arranged on a center plane of the ring.

5. The method of claim 3, further comprising printing a physical model by inputting the adjusted STL file into a rapid prototyping machine.

* * * * *